US011315920B2

(12) United States Patent
Long

(10) Patent No.: US 11,315,920 B2
(45) Date of Patent: Apr. 26, 2022

(54) ARRAY SUBSTRATE, ELECTROSTATIC DISCHARGE PROTECTION CIRCUIT AND DISPLAY APPARATUS

(71) Applicant: BOE TECHNOLOGY GROUP CO., LTD., Beijing (CN)

(72) Inventor: Chunping Long, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 69 days.

(21) Appl. No.: 16/956,483

(22) PCT Filed: Nov. 21, 2019

(86) PCT No.: PCT/CN2019/119982
§ 371 (c)(1),
(2) Date: Jun. 19, 2020

(87) PCT Pub. No.: WO2020/103909
PCT Pub. Date: May 28, 2020

(65) Prior Publication Data
US 2020/0350309 A1 Nov. 5, 2020

(30) Foreign Application Priority Data

Nov. 22, 2018 (CN) .......................... 201821934974.7

(51) Int. Cl.
*H01L 27/02* (2006.01)
*H01L 27/12* (2006.01)
*H01L 21/66* (2006.01)

(52) U.S. Cl.
CPC .......... *H01L 27/0288* (2013.01); *H01L 22/32* (2013.01); *H01L 27/1255* (2013.01)

(58) Field of Classification Search
CPC . H01L 27/0288; H01L 22/32; H01L 27/1255; H01L 27/02; G02F 1/133
(Continued)

(56) References Cited

U.S. PATENT DOCUMENTS 6,081,307 A * 6/2000 Ha ..................... G02F 1/136204
349/40
2006/0119757 A1 * 6/2006 Tsao ................... G02F 1/136204
349/40
(Continued)

FOREIGN PATENT DOCUMENTS

CN 103972228 A 8/2014
CN 104122690 A 10/2014
(Continued)

*Primary Examiner* — Duy T Nguyen
(74) *Attorney, Agent, or Firm* — Procopio, Cory, Hargreaves & Savitch LLP

(57) ABSTRACT

An array substrate includes a base substrate, at least one first signal line and at least one second signal line disposed at a first side of the base substrate, and at least one electrostatic discharge (ESD) protection device disposed at the first side of the base substrate. Each ESD protection device includes a first electrode coupled to one first signal line, a second electrode coupled to one second signal line, and an insulating medium disposed between the first electrode and the second electrode. An orthographic projection of the first electrode on the base substrate at least partially overlaps with an orthographic projection of the second electrode on the base substrate, and the ESD protection device is configured to discharge electrostatic charges on one of the first signal line and the second signal line that are coupled to the ESD protection device to the other one.

20 Claims, 10 Drawing Sheets

(58) Field of Classification Search
USPC .......................................................... 257/48
See application file for complete search history.

(56) References Cited

U.S. PATENT DOCUMENTS

| | | |
|---|---|---|
| 2010/0246079 A1 | 9/2010 | Suzuki |
| 2014/0210807 A1 | 7/2014 | Kim et al. |
| 2015/0054724 A1 | 2/2015 | Wang et al. |
| 2015/0115271 A1* | 4/2015 | Yoon ..................... H01L 27/124 257/72 |
| 2016/0071834 A1* | 3/2016 | Zhang ............... H01L 29/41733 257/72 |
| 2017/0032722 A1* | 2/2017 | Wang ..................... G09G 3/006 |
| 2017/0090236 A1* | 3/2017 | Yeh ....................... G02F 1/1368 |
| 2017/0200827 A1* | 7/2017 | Oda .................... H01L 29/4908 |
| 2020/0327855 A1* | 10/2020 | Lin ....................... G09G 3/3283 |
| 2020/0350309 A1 | 11/2020 | Long |

FOREIGN PATENT DOCUMENTS

| | | |
|---|---|---|
| CN | 207925467 U | 9/2018 |
| CN | 208904019 U | 5/2019 |

\* cited by examiner

ARRAY SUBSTRATE, ELECTROSTATIC DISCHARGE PROTECTION CIRCUIT AND DISPLAY APPARATUS

CROSS-REFERENCE TO RELATED APPLICATIONS

This application is a national phase entry under 35 USC 371 of International Patent Application No. PCT/CN2019/119982 filed on Nov. 21, 2019, which claims priority to Chinese Patent Application No 201821934974.7, filed on Nov. 22, 2018, which are incorporated herein by reference in their entirety.

TECHNICAL FIELD

The present disclosure relates to the field of display technologies, and in particular, to an array substrate, an electrostatic discharge protection circuit and a display apparatus.

BACKGROUND

Electrostatic discharge (ESD) is a common phenomenon in the manufacturing, transportation and use processes of display apparatuses. In the production and transportation processes of the display apparatuses, the yield of the display apparatus may be greatly reduced due to the ESD. In the working process of the display apparatus, electronic circuits in the display apparatus may not work properly due to the ESD, which causes display effect of the display apparatus to be reduced. Generally, an ESD protection circuit is disposed in a non-display area (such as an area provided with a frame) of the array substrate in the display apparatus to discharge or balance the static electricity with a high voltage, so that the display apparatus is protected from electrostatic damage in the manufacturing, transportation and working processes.

SUMMARY

In one aspect, an array substrate is provided. The array substrate includes a base substrate, at least one first signal line, at least one second signal line, and at least one electrostatic discharge (ESD) protection device. The at least one first signal line and the at least one second signal line are disposed at a first side of the base substrate. The at least one ESD protection device is disposed at the first side of the base substrate, and each of the at least one ESD protection device includes: a first electrode, a second electrode, and an insulating medium. The first electrode is coupled to one of the at least one first signal line. The second electrode is coupled to one of the at least one second signal line. The insulating medium is disposed between the first electrode and the second electrode. An orthographic projection of the first electrode on the base substrate at least partially overlaps with an orthographic projection of the second electrode on the base substrate, and the ESD protection device is configured to discharge electrostatic charges on one of the first signal line and the second signal line that are coupled to the ESD protection device to another one of the first signal line and the second signal line.

In some embodiments, the array substrate includes: a gate layer, a semiconductor layer, and a gate insulating layer. The gate layer is disposed at the first side of the base substrate, and the gate layer includes a first electrode of the ESD protection device. The semiconductor layer is disposed at a side of the gate layer proximate to the base substrate or a side of the gate layer away from the base substrate, and the semiconductor layer includes the second electrode of the ESD protection device. The gate insulating layer is disposed between the gate layer and the semiconductor layer, and a portion of the gate insulating layer between the first electrode and the second electrode of the ESD protection device is the insulating medium.

In some embodiments, a material of the second electrode is a heavily-doped semiconductor material, and a doping concentration of the heavily-doped semiconductor material ranges from $10^{18}/cm^3$ to $10^{22}/cm^3$.

In some embodiments, the gate layer is located at a side of the semiconductor layer away from the base substrate. The array substrate further includes an interlayer insulating layer and a source-drain electrode layer. The interlayer insulating layer is disposed on a side of the gate layer away from the base substrate. The source-drain electrode layer is disposed on a side of the interlayer insulating layer away from the base substrate, and the source-drain electrode layer includes the at least one first signal line and the at least one second signal line. A first via hole penetrating the interlayer insulating layer is disposed at a side of the first electrode of the ESD protection device away from the base substrate, and the first electrode of the ESD protection device is coupled to the first signal line through the first via hole. At least one second via hole penetrating the gate insulating layer and the interlayer insulating layer are disposed at a side of the second electrode of the ESD protection device away from the base substrate, and the second electrode of the ESD protection device is coupled to the second signal line through the at least one second via hole.

In some embodiments, the at least one second via hole includes one second via hole disposed at the side of the second electrode of the ESD protection device away from the base substrate. The ESD protection device further includes a first connection electrode. The first connection electrode is disposed on the side of the interlayer insulating layer away from the base substrate and in the second via hole. One end of the first connection electrode is coupled to the second signal line, and another end of the first connection electrode is coupled to one end of the second electrode proximate to the second signal line through the second via hole.

In some embodiments, the at least one second via hole includes two second via holes disposed at the side of the second electrode of the ESD protection device away from the base substrate. The ESD protection device further includes a second connection electrode. The second connection electrode is disposed on the side of the interlayer insulating layer away from the base substrate and in the two second via holes. A first end of the second connection electrode is coupled to the second signal line directly, a second end of the second connection electrode is coupled to one end of the second electrode away from the second signal line through one of the two second via holes, and a third end of the second connection electrode is coupled to one end of the second electrode proximate to the second signal line through another one of the two second via holes. An orthographic projection of a portion of the second connection electrode disposed on the side of the interlayer insulating layer away from the base substrate on the base substrate at least partially overlaps with an orthographic projection of the first electrode on the base substrate.

In some embodiments, the gate layer is located at a side of the semiconductor layer proximate to the base substrate. The array substrate further includes a source-drain electrode layer disposed on a side of the semiconductor layer away from the base substrate. The source-drain electrode layer includes the at least one first signal line and the at least one second signal line. A third via hole penetrating the gate insulating layer is disposed at a side of the first electrode of the ESD protection device away from the base substrate, and the first electrode of the ESD protection device is coupled to the first signal line through the third via hole. The second electrode of the ESD protection device is coupled to the second signal line directly.

In some embodiments, the at least one first signal line includes at least one test control line. Each of the at least one test control line is configured to transmit test control signals to the array substrate. The at least one second signal line includes at least one test signal line. Each of the at least one test signal line is configured to transmit test signals to the array substrate.

In some embodiments, the array substrate includes: a gate line, a data line, a common voltage signal line, a clock signal line, and a level signal line that are disposed at the first side of the base substrate. The at least one first signal line includes at least one of the gate line, the data line, the common voltage signal line, the clock signal line, and the level signal line. The at least one second signal line includes at least one of the gate line, the data line, the common voltage signal line, the clock signal line, and the level signal line.

In some embodiments, the at least one ESD protection device includes at least two ESD protection devices, the at least two ESD protection devices are divided into at least one group, and each group of ESD protection devices includes two ESD protection devices. The two ESD protection devices in each group of ESD protection devices are a first ESD protection device and a second ESD protection device. The array substrate includes a passivation layer, a pixel electrode layer and at least one fourth via hole. The passivation layer is disposed on a side of the source-drain electrode layer away from the base substrate. The pixel electrode layer is disposed on a side of the passivation layer away from the base substrate. The pixel electrode layer includes at least one third connection electrode.

At least one fourth via hole at least penetrates the passivation layer. One fourth via hole is disposed at a side of a second electrodes of the first ESD protection device away from the base substrate and one fourth via hole is disposed at a side of a second electrode of the second ESD protection device away from the base substrate. Two ends of one third connection electrode are coupled to the second electrode of the first ESD protection device and the second electrode of the second ESD protection device through fourth via holes respectively corresponding to the first ESD protection device and the second ESD protection device.

In some embodiments, in each group of ESD protection devices, a first electrode of the first ESD protection device and a first electrode of the second ESD protection device are coupled to a same first signal line through a same first via hole.

In some embodiments, in each group of ESD protection devices, an orthographic projection of the first ESD protection device on the base substrate and an orthographic projection of the second ESD protection device on the base substrate are symmetrically located at two opposite sides of an orthographic projection of the first signal line that is coupled to the first ESD protection device and second ESD protection device on the base substrate along a direction perpendicular to an extending direction of the first signal line respectively.

In some embodiments, in at least one group of ESD protection devices, first electrodes of ESD protection devices in each group are coupled to a same first signal line; and a second electrode of the at least one group of ESD protection devices located at a side of the first signal line along the direction perpendicular to the extending direction of the first signal line is coupled to one second signal line, and a second electrode of the at least one group of ESD protection devices located at an opposite side thereof along the direction perpendicular to the extending direction of the first signal line is coupled to another second signal line.

In some embodiments, the at least one ESD protection device includes at least two ESD protection devices, the at least two ESD protection devices are divided into at least one group, and each group of ESD protection devices includes two ESD protection devices. The two ESD protection devices in each group of ESD protection devices are a first ESD protection device and a second ESD protection device. The array substrate includes a passivation layer, a pixel electrode layer and at least one fourth via hole. The passivation layer is disposed on a side of the source-drain electrode layer away from the base substrate. The pixel electrode layer is disposed on a side of the passivation layer away from the base substrate, and the pixel electrode layer includes at least one third connection electrode, each fourth via hole at least penetrates the passivation layer, and one fourth via hole is disposed at a side of a second electrode of the first ESD protection device away from the base substrate and one fourth via hole is disposed at a side of a second electrode of the second ESD protection device away from the base substrate. two ends of one third connection electrode are respectively coupled to the second electrode of the first ESD protection device and the second electrode of the second ESD protection device through one fourth via hole corresponding to the first ESD protection device and one fourth via hole corresponding to the second ESD protection device.

In some embodiments, in each group of ESD protection devices a first electrode of the first ESD protection device and a first electrode of the second ESD protection device are coupled to a same first signal line through a same third via hole.

In some embodiments, in each group of ESD protection devices, an orthographic projection of the first ESD protection device on the base substrate and an orthographic projection of the second ESD protection device on the base substrate are symmetrically located at two opposite sides of an orthographic projection of the first signal line that is coupled to the first ESD protection device and the second ESD protection device on the base substrate along a direction perpendicular to an extending direction of the first signal line respectively.

In some embodiments, in at least one group of ESO protection devices, first electrodes of ESD protection devices in each group are coupled to a same first signal line; and a second electrode of the at least one group of ESD protection devices located at a side of the first signal line along the direction perpendicular to the extending direction of the first signal line is coupled to one second signal line, and a second electrode of the at least one group of ESD protection devices located at an opposite side thereof along the direction perpendicular to the extending direction of the first signal line is coupled to another second signal line.

In some embodiments, the first electrode includes one first sub-electrode and at least two second sub-electrodes. The at least two second sub-electrodes are arranged at a side of the first sub-electrode proximate to the second electrode along an extending direction of the first signal line and are arranged side by side along an extending direction of the first sub-electrode, and the first sub-electrode intersects with the at least two second sub-electrodes. One end of the first sub-electrode away from the second signal line along a direction perpendicular to the extending direction of the first signal line is coupled to the first signal line through the first via hole.

In some embodiments, the array substrate has a display area and a non-display area, and the non-display area is located at a periphery of the display area, and the at least one ESD protection device is disposed in the non-display area. The array substrate further includes at least one pad disposed in the non-display area. One pad is coupled to at least one test control line, and the at least one test control line is configured to transmit test control signals to the array substrate through the pad coupled to the at least one test control line. One pad is coupled to at least one test signal line, and the at least one test signal line is configured to transmit test signals to the array substrate through the pad coupled to the at least one test signal line.

In another aspect, an ESD protection circuit is provided. The ESD protection circuit is disposed in any one of the array substrates described above. The ESD protection circuit includes at least one ESD protection device, and a first end of each of the at least one ESD protection device is coupled to one of the at least one first signal line in the array substrate, and a second end of each of the at least one ESD protection device is coupled to one of the at least one second signal line in the array substrate. The ESD protection device is configured to discharge the electrostatic charges on one of the first signal line and the second signal line, which are coupled to the ESD protection device, to another one of the first signal line and the second signal line.

In some embodiments, the ESD protection device is a capacitor.

In some embodiments, first ends of the at least two ESD protection devices are coupled to a same first signal line, and second ends of the two ESD protection devices are coupled to a same second signal line or different second signal lines.

In yet another aspect, a display apparatus is provided. The display apparatus includes any one of the array substrates described above.

BRIEF DESCRIPTION OF THE DRAWINGS

In order to describe technical solutions in some embodiments of the present disclosure more clearly, accompanying drawings to be used in some embodiments of the present disclosure will be introduced briefly. Obviously, the accompanying drawings to be described below are merely accompanying drawings of some embodiments of the present disclosure, and a person of ordinary skill in the art may obtain other drawings according to these drawings. In addition, accompanying drawings in the following description may be regarded as schematic diagrams, and are not limitations on an actual size of a product, an actual process of a method and an actual timing of a signal that the embodiments of the present disclosure relate to.

DETAILED DESCRIPTION

Figure 1:
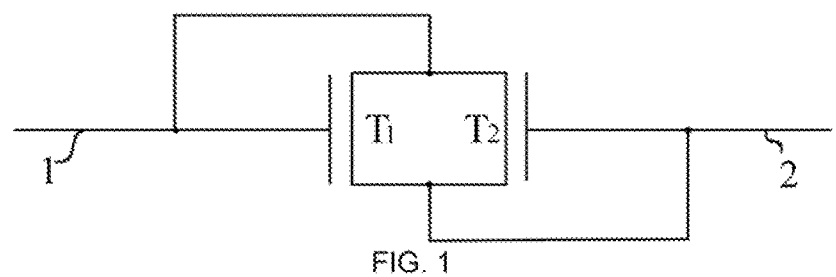
FIG. 1 is a structural diagram of an electrostatic discharge protection circuit, according to the related art.

Technical solutions in some embodiments of the present disclosure will be described clearly and completely with reference to accompanying drawings. Obviously, the described embodiments are merely some but not all of the embodiments of the present disclosure. All other embodiments obtained on a basis of the embodiments of the present disclosure by a person of ordinary skill in the art shall be included in the protection scope of the present disclosure.

Unless the context requires otherwise, term "comprise" and other forms thereof such as the third-person singular form "comprises" and the present participle form "comprising" in the description and the claims are construed as open and inclusive, i.e., "inclusive, but not limited to". In the description, terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment or example. In addition, the specific features, structures, materials or characteristics may be included in any one or more embodiments or examples in any suitable manner.

Terms such as "first" and "second" are only used for descriptive purposes and are not to be construed as indicating or implying the relative importance or implicitly indicating the number of indicated technical features below. Thus, features defined as "first" and "second" may explicitly or implicitly include one or more of the features. In the description of the embodiments of the present disclosure, the term "a/the plurality of" means two or more unless otherwise specified.

In the description of some embodiments, terms such as "coupled" and its extensions may be used. For example, term "coupled" may be used in the description of some embodiments to indicate that two or more components are in physical or electrical contact directly. However, terms such as "coupled" or "communicatively coupled" may also mean that two or more components are not in direct contact with each other but still cooperate or interact with each other. The embodiments disclosed herein are not necessarily limited to the contents herein.

In the related art, in order to prevent electrostatic discharge (ESD) phenomenon from affecting normal operation of a display apparatus, an ESD protection circuit is usually disposed in an array substrate of the display apparatus to protect electronic circuits in the display apparatus from electrostatic interference.

The array substrate includes a plurality of signal lines such as gate line(s), data line(s), clock signal line(s), common voltage signal line(s) and level signal line(s). In manufacturing, transportation and use processes of the display apparatus, static electricity may accumulate on the plurality of signal lines. At least one of the plurality of signal lines serves as at least one first signal line, and at least another one of the plurality of signal lines serves as at least one second signal line. The array substrate further includes at least one ESD protection circuit, and each ESD protection circuit is coupled to one of the at least one first signal line and one of the at least one second signal line, so as to discharge or balance the static electricity on the first signal line or the second signal line.

The ESD protection circuit includes at least two thin film transistors. For example, as shown in FIG. 1, two of the at least two thin film transistors are a first thin film transistors $T_1$ and a second thin film transistor $T_2$. A first electrode and a control electrode of the first thin film transistor $T_1$ are coupled to one first signal line 1, and a first electrode and a control electrode of the second thin film transistor $T_2$ are coupled to one second signal line 2. The first electrode of the first thin film transistor $T_1$ is coupled to a second electrode of the second thin film transistor $T_2$, and a second electrode of the first thin film transistor $T_1$ is coupled to the first electrode of the second thin film transistor $T_2$.

In a case where a large amount of electrostatic charges are instantaneously accumulated on the first signal line 1, a voltage at the control electrode of the first thin film transistor $T_1$ rises to reach a turn-on voltage, and the first thin film transistor $T_1$ is turned on. The electrostatic charges are transmitted to the second electrode of the first thin film transistor $T_1$ through the first electrode of the first thin film transistor $T_1$, and then discharged to the second signal line 2. Similarly, in a case where a large amount of electrostatic charges are instantaneously accumulated on the second signal line 2, a voltage at the control electrode of the second thin film transistor $T_2$ rises to reach a turn-on voltage, and the second thin film transistor $T_2$ is turned on. The electrostatic charges are transmitted to the second electrode of the second thin film transistor $T_2$ through the first electrode of the second thin film transistor $T_2$, and then discharged to the first signal line 1. In this way, the electrostatic charges accumulated on the first signal line 1 or the second signal line 2 are discharged and the influence of the electrostatic charges on the normal operation of the display apparatus is avoided.

However, in a case where the control electrode of the thin film transistor is subject to an impact of a large current in an instant, an insulating medium between the control electrode (gate) and the first electrode (source or drain) may be broken down, or an insulating medium between the control electrode (gate) and the second electrode (source or drain) may be broken down, thereby resulting in a threshold voltage drift of the thin film transistor, or a short circuit between the gate and the source or a short circuit between the gate and the drain. Therefore, in a case where the above ESD protection circuit is adopted and a large amount of electrostatic charges are accumulated, if the thin film transistor is subject to a large current or is instantaneously impacted by a large amount of charges, the gate of the thin film transistor may be broken down, causing the thin film transistor to burn out, so that the ESD protection circuit cannot work normally and cannot discharge the electrostatic charges.

Some embodiments of the present disclosure provide an array substrate 100. As shown in FIGS. 2A to 6C, the array substrate 100 includes: a base substrate 3, at least one first signal line 1, at least one second signal line 2, and at least one ESD protection device 4.

The at least one first signal line 1 and the at least one second signal line 2 are both disposed at a first side A of the base substrate 3, and a side opposite to the first side A is a second side B of the base substrate 3. The at least one first signal line is at least one of a plurality of signal lines (for example, the gate line(s), the data line(s), and the level signal line(s)) disposed at the first side A of the base substrate 3, and the at least one second signal line is at least another one of the plurality of signal lines (for example, the gate line(s), the data line(s), and the level signal line(s)) disposed at the first side A of the base substrate 3. Static electricity may accumulate on the at least one first signal line 1 and the at least one second signal line 2.

Each of the at least one ESD protection device 4 includes: a first electrode 41, a second electrode 42, and an insulating medium 43.

The first electrode 41 is coupled to one of the at least one first signal line 1. The second electrode 42 is coupled to one of the at least one second signal line 2. The insulating medium 43 is disposed between the first electrode 41 and the second electrode 42, and the insulating medium 43 is configured such that ESD capacitance C exists between the first electrode 41 and the second electrode 42. The ESD capacitance C is configured to discharge the electrostatic charges on one of the first signal line 1 and the second signal line 2 that are coupled thereto to the other.

The array substrate 100 provided by some embodiments of the present disclosure is provided with at least one ESD protection device 4. The first electrode 41 of each ESD protection device 4 is coupled to one first signal line 1, the second electrode 42 of each ESD protection device 4 is coupled to one second signal line 2, and the ESD capacitance C exists between the first electrode 41 and the second electrode 42. In this way, in a case where a large amount of electrostatic charges instantaneously accumulate on the first signal line 1, the ESD capacitance C existing in the ESD protection device 4 discharges the electrostatic charges from the first signal line 1 to the second signal line 2 to shunt the electrostatic charges. Or, in a case where a large amount of electrostatic charges instantaneously accumulate on the second signal line 2, the ESD capacitance C existing in the ESD protection device 4 discharges the electrostatic charges from the second signal line 2 to the first signal line 1 to shunt the electrostatic charges. In this way, whether a large amount of electrostatic charges instantaneously accumulate on the first signal line 1 or on the second signal line 2, the electrostatic charges may be discharged through the ESD protection device 4, so that the electrostatic charges are prevented from affecting the normal operation of the electronic circuits (for example, a pixel driving circuit).

In the process of shunting the electrostatic charges, an ESD capacitor is formed between the first electrode 41 and the second electrode 42 of each ESD protection device 4, and electrostatic protection is achieved by utilizing features of the ESD capacitor. On one hand, a voltage between two electrodes of the capacitor does not change suddenly, so the ESD capacitor is capable of suppressing static electricity. Especially for a circuit having capacitor(s) with large capacitance(s), the circuit does not even require the ESD protection. On the other hand, the interference of the ESD to electronic circuits is mainly conducted interference and radiated interference, and the static electricity itself is a broadband signal; by utilizing the capacitor, a path for the electrostatic charges to be better discharged may be provided, and generated static electricity may not be coupled to sensitive circuits. Therefore, decoupling ability of the first signal line 1 and the second signal line 2 may be improved by using the ESD capacitor to decouple, and anti-interference ability of the first signal line 1 and the second signal line 2 may be improved.

In the array substrate provided by the present disclosure, the ESD capacitance C existing between the first electrode 41 and the second electrode 42 of the ESD protection device 4 is used to realize the discharge of the electrostatic charges, and the thin film transistor or the like is not used. Therefore, a problem in the ESD protection circuit in the related art that the gate of the thin film transistor may be broken down and the thin film transistor may be burnt out is avoided when the thin film transistor is subject to a large current or is instantaneously impacted by a large amount of charges.

Figure 2A:
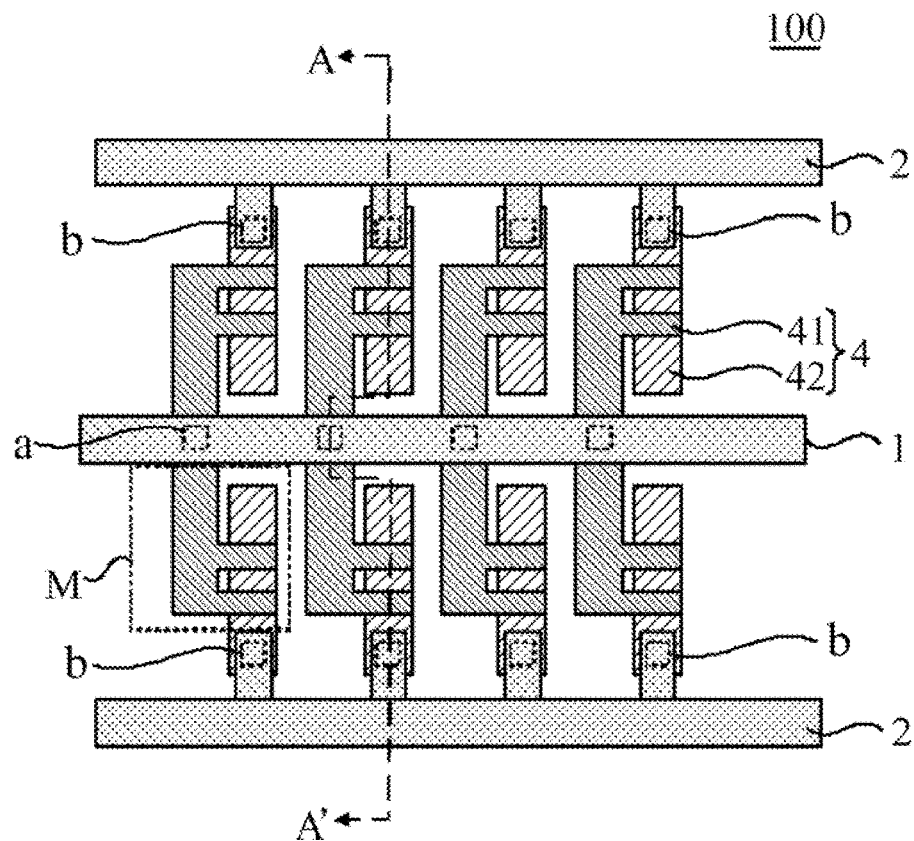
FIG. 2A is a structural diagram of an array substrate, according to some embodiments of the present disclosure.
Figure 2B:
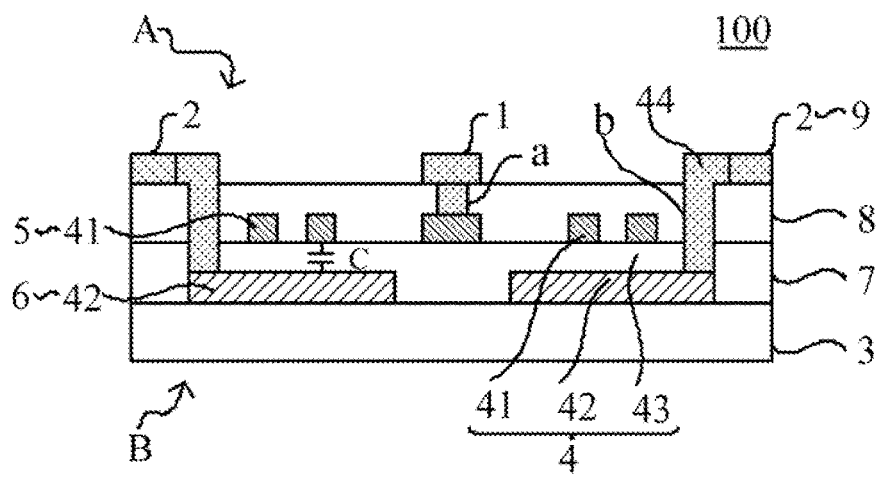
FIG. 2B is a sectional view of the array substrate along section line AA' in FIG. 2A.

In some embodiments, as shown in FIGS. 2A and 2B, the array substrate 100 includes a gate layer 5, a semiconductor layer 6, and a gate insulating layer 7.

The gate layer 5 is disposed at the first side A of the base substrate 3, and the gate layer 5 includes the first electrode 41 of the ESD protection device 4 and a gate of a driving transistor.

The semiconductor layer 6 is disposed at a side of the gate layer 5 proximate to or away from the base substrate 3, and the semiconductor layer 6 includes the second electrode 42 of the ESD protection device 4, and an active layer of the driving transistor.

The gate insulating layer 7 is disposed between the gate layer 5 and the semiconductor layer 6, and a portion of the gate insulating layer 7 between the first electrode 41 and the second electrode 42 of the ESD protection device 4 serves as the insulating medium 43.

In some embodiments, the first electrode 41 of the ESD protection device 4 and the gate of the driving transistor are disposed in a same layer, so that the first electrode 41 of the ESD protection device may be formed in the same layer as the gate of the driving transistor simultaneously. The second electrode 42 of the ESD protection device 4 and the active layer of the driving transistor are disposed in a same layer, so that the second electrode 42 of the ESD protection device may be formed in the same layer as the active layer of the driving transistor simultaneously.

In the process of manufacturing the array substrate 100, since the first electrode 41 and the second electrode 42 in the ESD protection device 4 are disposed in the same layer as the gate and the active layer of the driving transistor respectively, the gate of the driving transistor and the first electrode 41 of the ESD protection device 4 may be formed through a single patterning process, and the active layer of the driving transistor and the second electrode 42 of the ESD protection device 4 may be formed through a single patterning process. In this way, steps of manufacturing the array substrate 100 may be reduced, and time of manufacturing the array substrate 100 may be shortened, and thus efficiency of manufacturing the array substrate 100 is improved. Moreover, since the gate and the first electrode 41 may be formed by using a same mask, and the active layer and the second electrode 42 may be formed by using a same mask, the number of masks may be reduced, thereby saving costs.

In some embodiments, the material of the second electrode 42 is a heavily-doped semiconductor material, and a doping concentration of the heavily-doped semiconductor material ranges from $10^{18}/cm^3$ to $10^{22}/cm^3$.

For example, the material of the second electrode 42 may be a heavily-doped low temperature poly-silicon (LTPS) material. In some examples, the second electrode 42 is formed as follows. An amorphous silicon thin film is formed at the first side A of the base substrate 3 through a deposition process, and the amorphous silicon thin film crystallizes to form a poly-silicon thin film through an excimer laser annel (ELA) process or a solid phase crystallization (SPC) process. Then, the poly-silicon thin film is etched through a photolithography process to form a plurality of first poly-silicon structures each having a shape of the second electrode 42 and a plurality of second poly-silicon structures each having a shape of the active layer of the driving transistor. High-concentration ion implantation is performed to the plurality of first poly-silicon structures. Ions are embedded in the crystal structure of the poly-silicon as donors or acceptors that provide carriers. The concentration of the ions may be selected according to actual needs, for example, $10^{16}/cm^3$, $10^{19}/cm^3$, $10^{20}/cm^3$, $10^{21}/cm^3$, $10^{22}/cm^3$. Thus, the plurality of first polysilicon structures are converted into a plurality of heavily-doped poly-silicon structures with low-resistance, and the plurality of heavily-doped poly-silicon structures with low-resistance serve as the second electrodes 42.

The material of the second electrode 42 is a heavily-doped semiconductor material. Since the resistance of the heavily-doped semiconductor material is far less than the resistance of an insulating material and much greater than the resistance of an metal material, the resistance of the second electrode 42 is far less than the resistance of the insulating medium 43 and much greater than the resistance of the first signal line 1 and the resistance of the second signal line 2 (the signal line is generally made of metal material). A resistance value of the heavily-doped semiconductor material is between the resistance value of the insulating material and the resistance value of the metal material, and the resistance value of the heavily-doped semiconductor material may be decrease when subjected to a high voltage or a large current. In this way, when there is not a large amount of electrostatic charges instantaneously accumulated on the first signal line 1 or the second signal line 2, or there is a small amount of electrostatic charges accumulated on the first signal line 1 or the second signal line 2, the ESD protection device 4 does not work. When there is a large amount of electrostatic charges accumulated on the first signal line 1 or the second signal line 2, a voltage at the second electrode 42 is high, the resistance value of the second electrode 42 decreases, and the conductivity of the second electrode 42 is improved, so that ESD capacitance C exists between the first electrode 41 and the second electrode 42, which may discharge the electrostatic charges on the first signal line 1 to the second discharge line, or discharge the electrostatic charges on the second signal line 2 to the first signal line 1, thereby shunting the electrostatic charges.

In the array substrate 100 provided by some embodiments of the present disclosure, according to arrangements of functional film layers included in the array substrate 100, the ESD protection device has different structures, which are not limited herein by the present disclosure as long as the ESD protection device may play a role of electrostatic protection. The arrangements of functional film layers in the array substrate 100 and structures of corresponding ESD protection devices 4 will be exemplarily described below.

In a case where the gate layer 5 is located at a side of the semiconductor layer 6 away from the base substrate 3, in some embodiments, as shown in FIGS. 2A to 4C, the array substrate 100 further includes an interlayer insulating layer 8 and a source-drain electrode layer 9.

The interlayer insulating layer 8 is disposed on a side of the gate layer 5 away from the base substrate 3. The source-drain electrode layer 9 is disposed on a side of the interlayer insulating layer 8 away from the base substrate 3. The source-drain electrode layer 9 includes the at least one first signal line 1, the at least one second signal line 2, and source(s) and drain(s) of driving transistor(s).

A first via hole a penetrating the interlayer insulating layer 8 is disposed at a side of the first electrode 41 of the ESD protection device 4 away from the base substrate 3, and the first electrode 41 of the ESD protection device 4 is coupled to the first signal line 1 through the first via hole a. Second via hole(s) b penetrating the gate insulating layer 7 and the interlayer insulating layer 8 is disposed at a side of the second electrode 42 of the ESD protection device 4 away from the base substrate 3, and the second electrode 42 of the ESD protection device 4 is coupled to the second signal line 2 through the second via hole(s) b.

In some embodiments, the at least one first signal line 1, the at least one second signal line 2 and the source(s) and the drain(s) of the driving transistor(s) are disposed in a same layer. In this way, the at least one first signal line 1 and the at least one second signal line 2 are formed in the same layer as the source(s) and the drain(s) of the driving transistor(s) simultaneously, so that the steps of manufacturing the array substrate 100 may be reduced, and the time of manufacturing the array substrate 100 may be shortened, thereby improving the efficiency of manufacturing the array substrate 100.

In some examples, as shown in FIGS. 2A and 2B, one second via hole b is disposed at a side of the second electrode 42 of each ESD protection device 4 away from the base substrate 3. The ESD protection device 4 further includes a first connection electrode 44. One end of the first connection electrode 44 is coupled to the second signal line 2, and another end of the first connection electrode 44 is coupled to one end of the second electrode 42 proximate to the second signal line 2 through the second via hole b corresponding to each ESD protection device 4.

In some examples, the first connection electrode 44 serves to connect the second signal line 2 to the second electrode 42. When the ESD protection device 4 works, the electrostatic charges on the first signal line 1 may be discharged to the second signal line 2 through the first electrode 41, the second electrode 42 and the first connection electrode 44, or the electrostatic charges on the second signal line 2 may be discharged to the first signal line 1 through the first connection electrode 44, the second electrode 42 and the first electrode 41, so that the electrostatic charges are shunted.

Figure 3A:
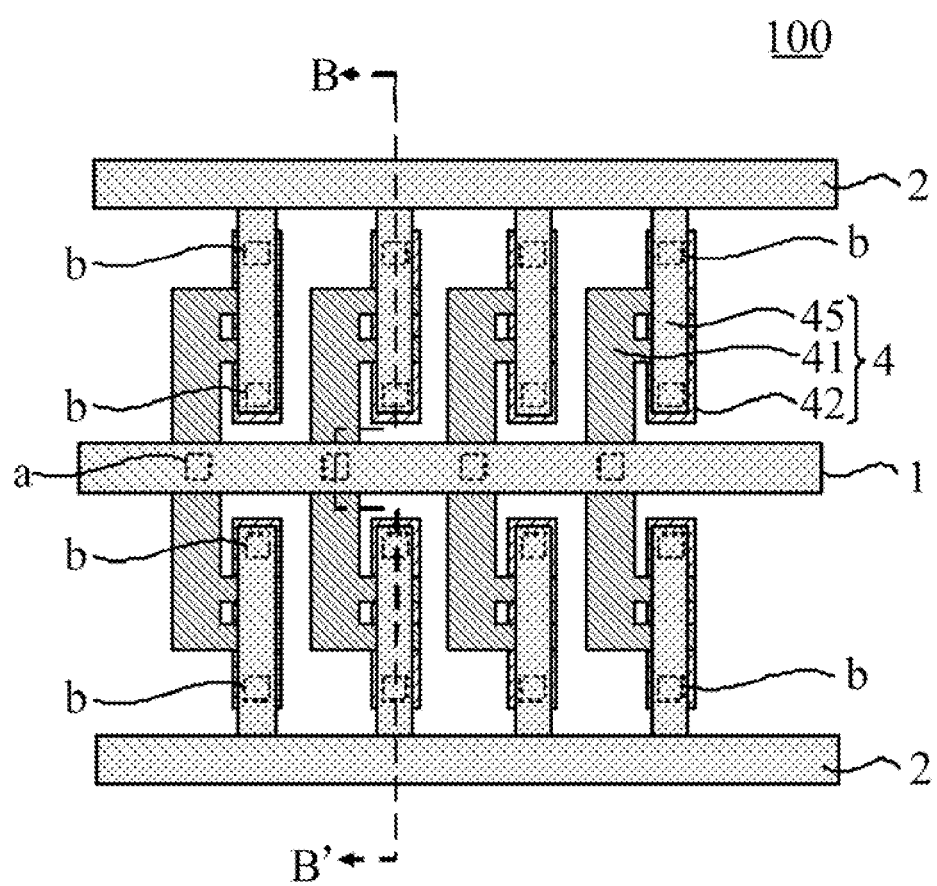
FIG. 3A is a structural diagram of another array substrate, according to some embodiments of the present disclosure.
Figure 3B:
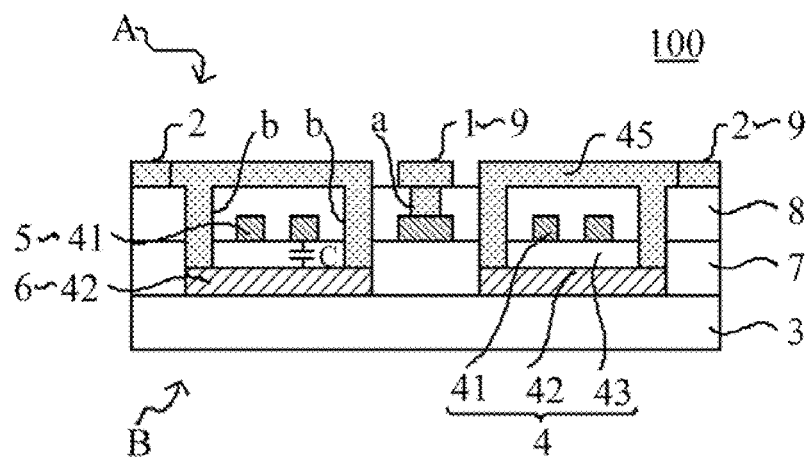
FIG. 3B is a sectional view of the array substrate along section line BB' in FIG. 3A.

In some other examples, as shown in FIGS. 3A and 3B, two second via holes b are disposed at a side of the second electrode 42 of each ESD capacitor C away from the base substrate 3. The ESD protection device 4 further includes a second connection electrode 45. The second connection electrode 45 is disposed on a side of the interlayer insulating layer away from the base substrate 3 and in the two second via holes b. A first end of the second connection electrode 45 is coupled to the second signal line 2 directly, a second end of the second connection electrode 45 is coupled to one end of the second electrode 42 away from the second signal line 2 through one of the two second via holes b, and a third end of the second connection electrode 45 is coupled to one end of the second electrode 42 proximate to the second signal line 2 through the other one of the two second via holes b.

An orthographic projection of a portion of the second connection electrode 45 disposed on the side of the interlayer insulating layer away from the base substrate 3 on the base substrate 3 at least partially overlaps with an orthographic projection of the first electrode 41 on the base substrate 3.

In some examples, the second connection electrode 45 serves to connect the second signal line 2 to the second electrode 42. Moreover, since the orthographic projection of the portion of the second connection electrode 45 disposed on the side of the interlayer insulating layer away from the base substrate 3 on the base substrate 3 at least partially overlaps with the orthographic projection of the first electrode 41 on the base substrate 3, capacitance may exists between the portion of the second connection electrode 45 disposed on the side of the interlayer insulating layer away from the base substrate 3 and the first electrode 41. The capacitance may be used as ESD capacitance, which is equivalent to increase the ESD capacitance in the ESD protection device 4. In a case where a large amount of electrostatic charges instantaneously accumulate on the first signal line 1, the electrostatic charges are transmitted from the first electrode 41 to the second electrode 42 and the second connection electrode 45 simultaneously through the ESD capacitance C between the first electrode 41 and the second electrode 42 and ESD capacitance C between the portion of the second connection electrode 45 disposed on the side of the interlayer insulating layer away from the base substrate 3 and the first electrode 41, so that the electrostatic charges may be discharged to the second signal line 2 faster. Similarly, in a case where a large amount of electrostatic charges instantaneously accumulate on the second signal line 2, the electrostatic charges may be discharged to the first signal line 1 faster, thereby further improving the electrostatic protection effect of the ESD protection device 4.

In a case where the gate layer 5 is located at a side of the semiconductor layer 6 proximate to the base substrate 3, in some embodiments, as shown in FIGS. 5A to 6C, the array substrate 100 further includes a source-drain electrode layer 9.

The source-drain electrode layer 9 is disposed on a side of the semiconductor layer 6 away from the base substrate 3, and the source-drain electrode layer 9 includes the at least one first signal line 1, the at least one second signal line 2, and the source(s) and the drain(s) of the driving transistor(s).

A third via hole c penetrating the gate insulating layer 7 is disposed at a side of the first electrode 41 of the ESD protection device away from the base substrate 3, and the first electrode 41 of the ESD protection device 4 is coupled to the first signal line 1 through the third via hole c. The second electrode 42 of the ESD protection device 4 is coupled to the second signal line 2.

In some embodiments, the at least one first signal line 1, the at least one second signal line 2, and the source(s) and the drain(s) of the driving transistor(s) are disposed in a same layer. In this way, the at least one first signal line 1 and the at least one second signal line 2 are formed in the same layer as the source(s) and the drain(s) of the driving transistor(s) simultaneously, so that the steps of manufacturing the array substrate 100 may be reduced, and the time of manufacturing the array substrate 100 may be shortened, thereby improving the efficiency of manufacturing the array substrate 100.

Since the source-drain electrode layer 9 is in contact with the semiconductor layer 6, the second electrode 42 may be directly coupled to the second signal line 2 without via hole(s), thereby simplifying the manufacturing process of the array substrate 100.

Figure 10A:
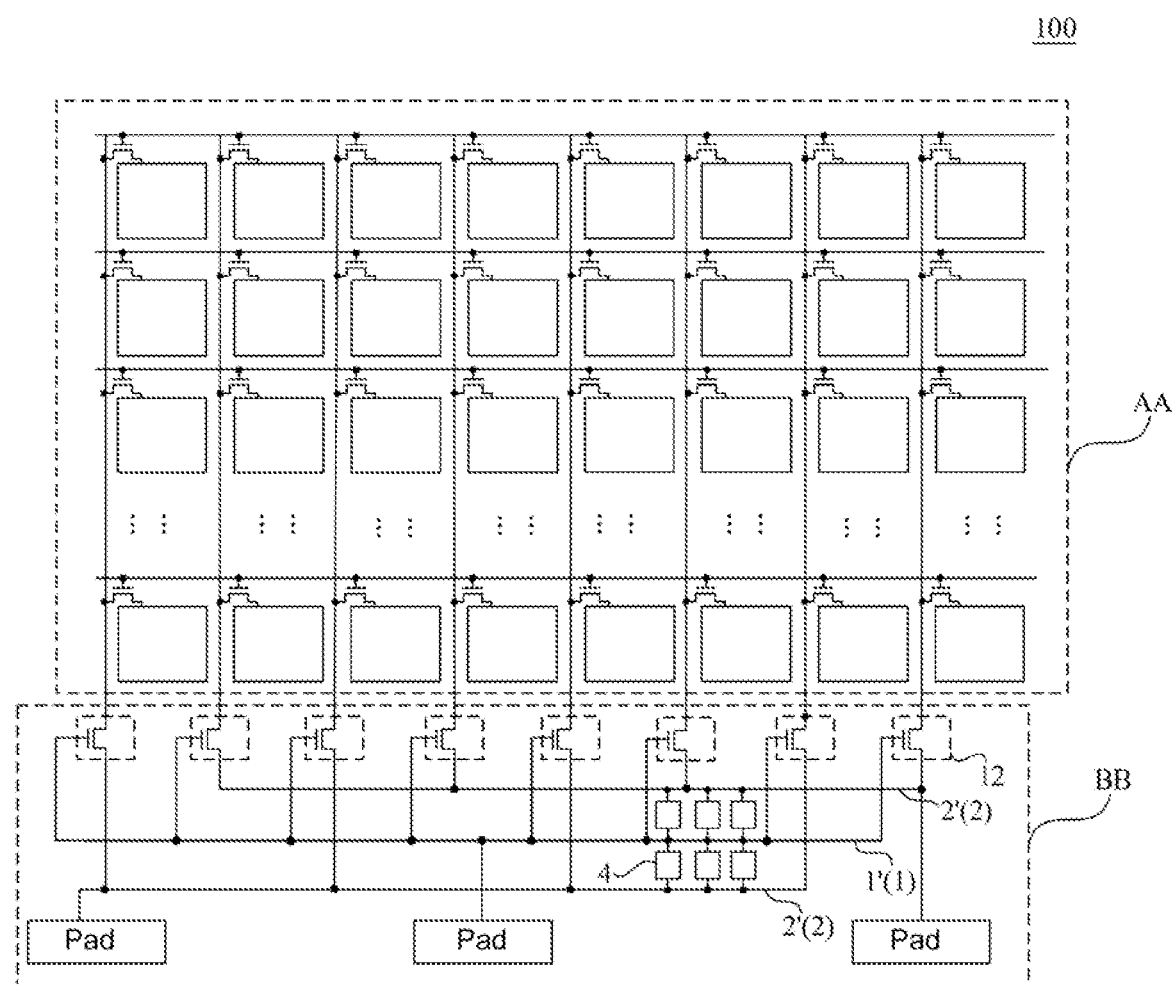
FIG. 10A is a structural diagram of yet another array substrate, according to some embodiments of the present disclosure.
Figure 10B:
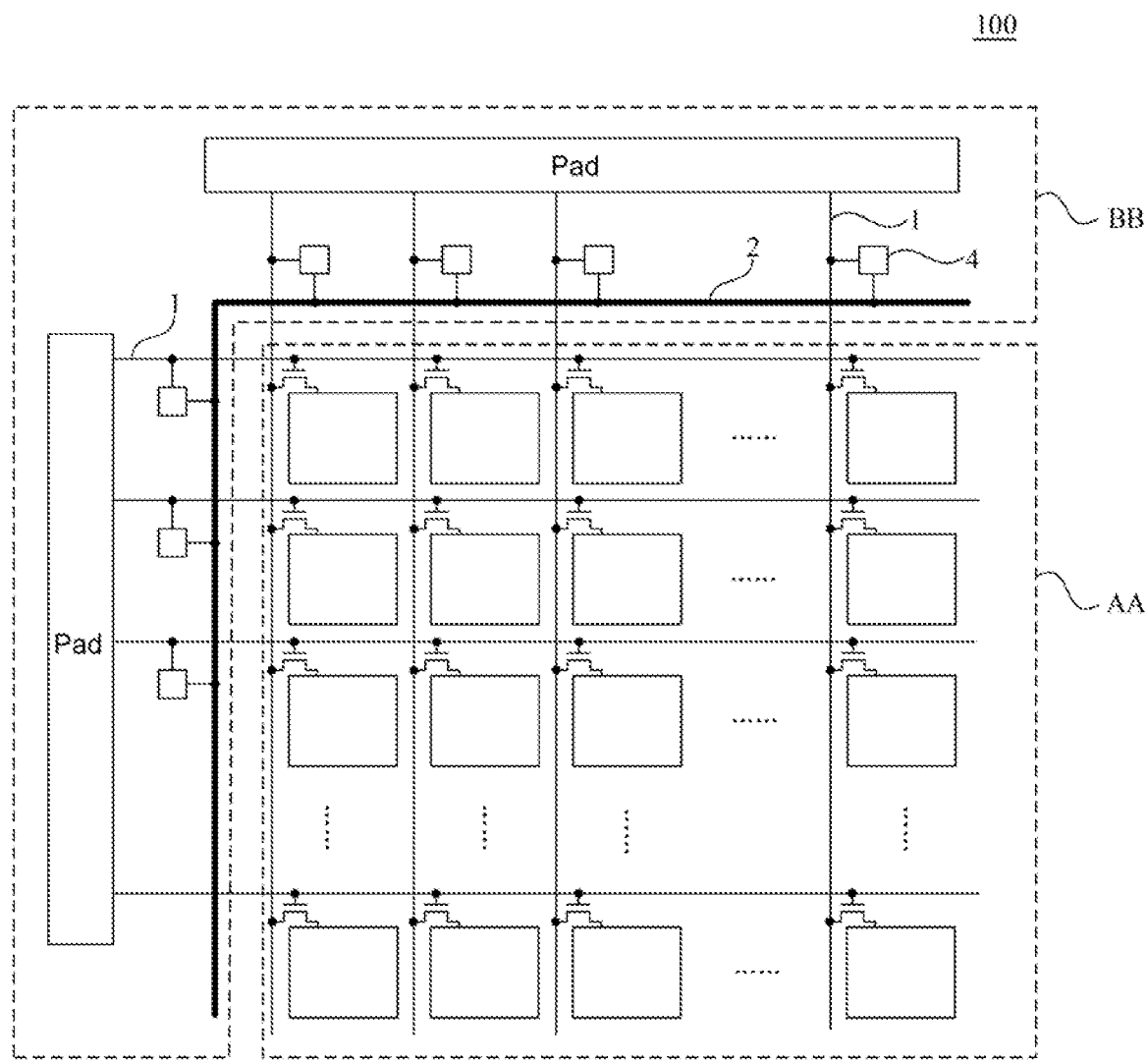
FIG. 10B is a structural diagram of yet another array substrate, according to some embodiments of the present disclosure.

In some embodiments, as shown in FIGS. 10A and 10B, the array substrate 100 has a display area AA and a non-display area BB, and the non-display area BB is disposed at the periphery of the display area AA. For example, the non-display area BB surrounds the display area AA. Or, in a case where the display area AA has a rectangular shape, the non-display area BB is disposed at one side, two sides (two opposite sides, or two adjacent sides) or three sides of the display area AA.

In some embodiments, the signal lines in the array substrate need to be tested before the array substrate leaves the factory. For example, the gate lines or the data lines in the array substrate are tested. A test of the data lines in the array substrate is taken as an example for description below. With respect to the test of the data lines, at least one test circuit, at least one test control line, and at least one test signal line are needed to be arranged in the array substrate.

As shown in FIG. 10A, the at least one test circuit 12 is disposed at the first side of the base substrate, and each of the at least one test circuit 12 is coupled to one data line included in the array substrate. For example, each test circuit 12 includes at least one thin film transistor, and a second electrode (a drain) of each of the at least one thin film transistor is coupled to one data line.

The at least one test control line 1' is disposed at the first side of the base substrate, and each of the at least one test control line 1' is coupled to all of the at least one test circuit 12. The test control line 1' is configured to transmit test control signals to the array substrate 100. That is, the test control line 1' transmits the test control signals to the at least one test circuit 12 in the array substrate 100. For example, in a case where each test circuit 12 includes at least one thin film transistor, each test control line 1' is coupled to a control electrode (a gate) of one thin film transistor in each test circuit 12, so that the test circuit 12 is turned on or off under action of the test control signals transmitted by the test control line 1'. In some examples, the test control signals are transmitted to the at least one test control line through pad(s) in the array substrate 100. The pad(s) are coupled to control chip(s), and the control chip(s) provide the test control signals to the pad(s).

The at least one test signal line 2' is disposed at the first side of the base substrate, and each of the at least one test signal line 2' is coupled to at least one test circuit 12. The test signal line 2' is configured to transmit test signals to the array substrate 100. That is, the test signal line 2' transmits the test signals to the at least one test circuit 12 in the array substrate 100. For example, in a case where each test circuit 12 includes at least one thin film transistor, each test signal line 2' is coupled to a first electrode (a source) of one thin film transistor in at least one test circuit 12 to transmit the test signals to the data line when the test circuit 12 is turned on. In some examples, the test signals are transmitted to the at least one test signal line through the pad(s) in the array substrate 100. The pad(s) are coupled to the control chip(s), and the control chip(s) provide the test signals to the pad(s).

In some examples, the at least one test signal line 2' includes two test signal lines 2'. One of the two test signal line 2' is coupled to odd-numbered data lines (e.g., 1, 3, 5, 7) through the test circuits 12, and the other test signal line 2' is coupled to even-numbered data lines (e.g., 2, 4, 6, 8) through the test circuits 12.

The test process of the array substrate 100 is as follows. Under control of the test control signals transmitted by the at least one test control line 1', at least one test circuit is turned on, and the test signals transmitted by at least one test signal line 2' coupled to the at least one test circuit are transmitted to corresponding data line(s) to detect the corresponding data line(s), for example, to detect whether the corresponding data line(s) are in an open circuit situation.

In some examples, the at least one test circuit 12, the at least one test control line 1', and the at least one test signal line 2' are disposed in the non-display area BB.

In the process of manufacturing the array substrate 100 or in the process of testing the array substrate 100, electrostatic charges may accumulate on the at, least one test control line 1' and the at least one test signal line 2', which may affect the test work of the array substrate 100.

In some embodiments, as shown in FIG. 10A, the at least one first signal line 1 includes test control line(s) 1', and the at least one second signal line 2 includes test signal line(s) 2'. The at least one ESD protection device 4 is disposed in the non-display area BB. Each ESD protection device 4 is coupled to one test control line 1' and is coupled to one test signal line 2'.

In the process of testing the array substrate 100, in a case where a large amount of electrostatic charges instantaneously accumulate on the test control line 1', the electrostatic charges may be discharged onto the test signal line 2' through the ESD protection device(s) 4. Or, in a case where a large amount of electrostatic charges instantaneously accumulate on the test signal line 2', the electrostatic charges may be discharged onto the test control line 1' through the ESD protection device(s) 4. In this way, the generated static electricity are prevented from coupling to the electronic circuits, such as the test circuits 12, and the normal operation of the test work of the array substrate 100 is ensured.

In some other embodiments, the array substrate 100 further includes: gate line(s), data line(s), common voltage signal line(s), clock signal line(s), and level signal line(s), all of which are disposed at the first side A of the base substrate 3. For example, the level signal line(s) include high-level signal line(s) (Vgh), low-level signal line(s) (Vgl), first power signal line(s) (Vdd), second power signal line(s) (Vss), or the like.

There are a plurality of pixels in the display area AA, and each of the plurality of pixels corresponds to one pixel driving circuit. The pixel driving circuits operate under action of the data signals transmitted by the data line(s) and the gate scanning signals transmitted by the gate line(s) to make the display area AA realize display. However, static electricity may accumulate on the gate line(s), the data line(s), the common voltage signal line(s), the clock signal line(s), and the level signal line(s), which may affect the normal operation of electronic circuits (such as the pixel driving circuit) in the array substrate.

In some other embodiments, the at feast one first signal line 1 includes at least one of the gate line(s), the data line(s), the common voltage signal line(s), the clock signal line(s), and the level signal line(s). The at least one second signal line 2 includes at least one of the gate line(s), the data line(s), the common voltage signal line(s), the clock signal line(s), and the level signal line(s). For example, as shown in FIG. 10B, the at least one first signal line 1 includes at least one data line and at least one gate line, and the at least one second signal line 2 is a common voltage signal line. The at least one ESD protection device 4 is located in the non-display area BB, Each ESD protection device 4 is coupled to one first signal line 1 and is coupled to one second signal line 2.

In the array substrate 100 provided by the embodiments of the present disclosure, the at least one first signal line 1 or the at least one second signal line 2 includes at least one of multiple types of signal lines in the array substrate 100. In this way, during the display process of the array substrate 100, the electrostatic charges on one of the first signal line 1 and the second signal line 2 that are coupled to the ESD protection device 4 may be discharged to the other one of the first signal line 1 and the second signal line 2 through the ESD protection device 4. For example, the electrostatic charges accumulated on a gate line or a data line may be discharged to a common voltage signal line, and thereby the electrostatic charges are shunted to protect the display of the array substrate 100 from interference of static electricity.

In some embodiments, as shown in FIGS. 10A and 10B, the array substrate 100 further includes at least one pad disposed in the non-display area BB. Each of the at least one pad is coupled to at least one first signal line 1 or at least one second signal line 2, and is configured to transmit electrical signals to the at least one first signal line 1 or the at least one second signal line 2. For example, in a case where the at least one first signal line 1 includes at least one test control line 1', the pad coupled to the at least one test control line 1' is configured to transmit test control signals to the at least one test control line 1'. In a case where the at least one first signal line 1 includes at least one gate line, the pad coupled to the at least one gate line is configured to transmit gate scanning signals to the at least one gate line.

In some embodiments, the first electrode 41 of each of the at least two ESD protection devices 4 is coupled to a same first signal line 1. In the at least two ESD protection devices 4, a second electrode 42 of each of a part of the at least two ESD protection devices 4 are coupled to one second signal line 2, and a second electrode 42 of each of another part of the at least two ESD protection devices 4 are coupled to another second signal line 2.

As shown in FIGS. 2A to 6C, the first electrode 41 of each of two ESD protection devices 4 is coupled to a same first signal line 1. In the two ESD protection devices 4 coupled to the same first signal line 1, one of the two ESD protection devices 4 is coupled to one second signal line 2, and the other ESD protection device 4 is coupled to another second signal line 2.

In this arrangement, in a case where a large amount of electrostatic charges instantaneously accumulate on the first signal line 1, the electrostatic charges may be discharged to different second signal lines 2 through at least two ESD protection devices 4, and the number of paths for the discharge of the electrostatic charges on the first signal line 1 is increased, so that the discharge of the electrostatic charges may be faster and more efficient, and the ESD protection effect may be improved.

As a possible design, the at least two ESD protection devices 4 are divided into at least one group, and each group includes two ESD protection devices 4 that are a first ESD protection device 4 and a second ESD protection device 4 respectively.

In a case where the array substrate 100 further includes the source-drain electrode layer 9, as shown in FIGS. 4A to 4C and FIGS. 6A to 6C, the array substrate 100 further includes a passivation layer 10 and a pixel electrode layer 11.

The passivation layer 10 is disposed on a side of the source-drain electrode layer 9 away from the base substrate 3. The pixel electrode layer 11 is disposed on a side of the passivation layer 10 away from the base substrate 3, and the pixel electrode layer 11 includes at least one third connection electrode 11a and a plurality of pixel electrodes.

A fourth via hole d at least penetrating the passivation layer 10 is disposed at a side of the second electrode 42 of each of the first ESD protection device 4 and the second ESD protection device 4 away from the base substrate 3. Two ends of one of the at least one third connection electrode 11a are respectively coupled to the second electrode 42 of the first ESD protection device 4 and the second electrode 42 of the second ESD protection device 4 through the fourth via hole d corresponding to the first ESD protection device 4 and the fourth via hole d corresponding to the second ESD protection device 4.

Figure 4A:
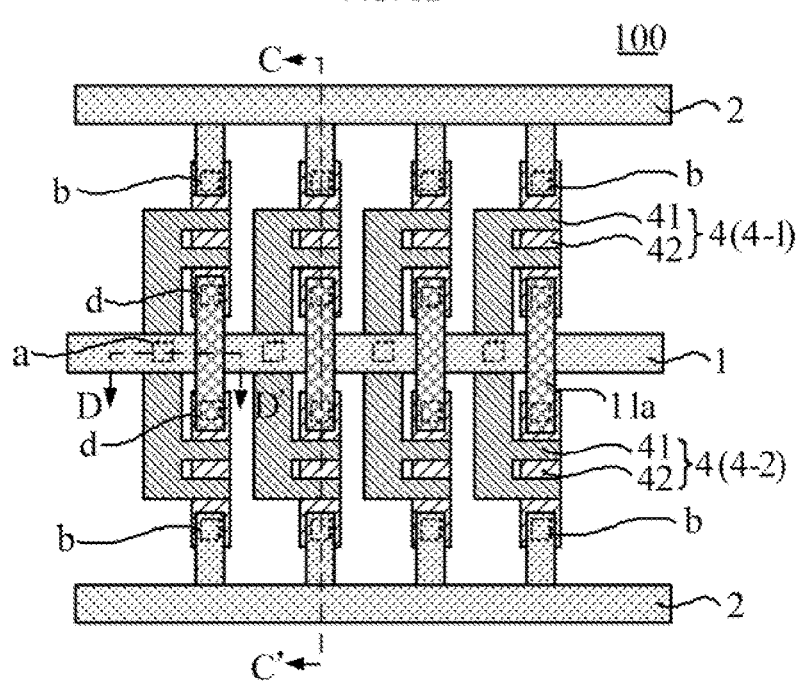
FIG. 4A is a structural diagram of yet another array substrate, according to some embodiments of the present disclosure.
Figure 4B:
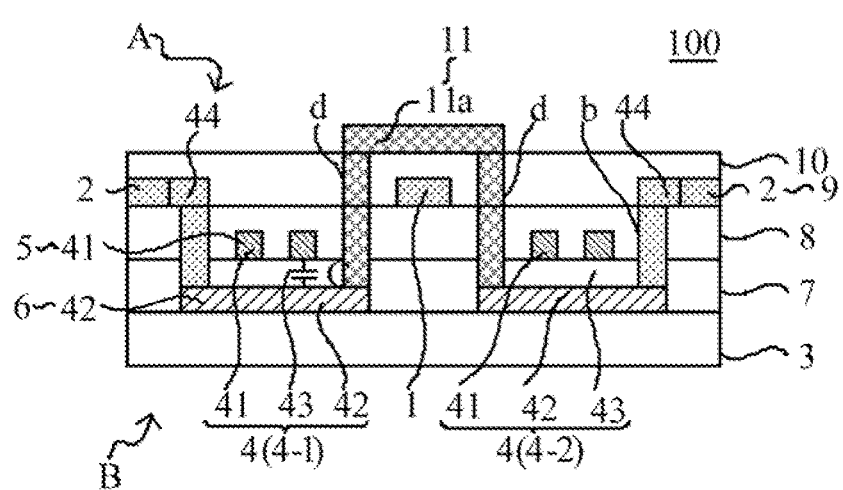
FIG. 4B is a sectional view of the array substrate along section line CC' in FIG. 4A.
Figure 4C:
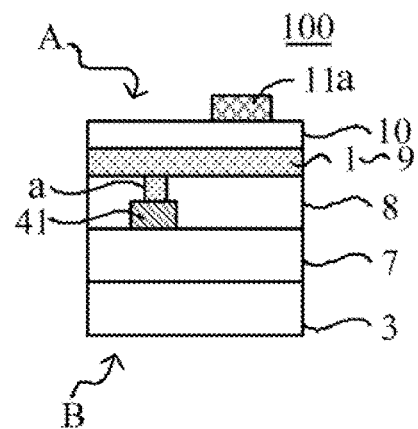
FIG. 4C is a sectional view of the array substrate along section line DD' in FIG. 4A.
Figure 5A:
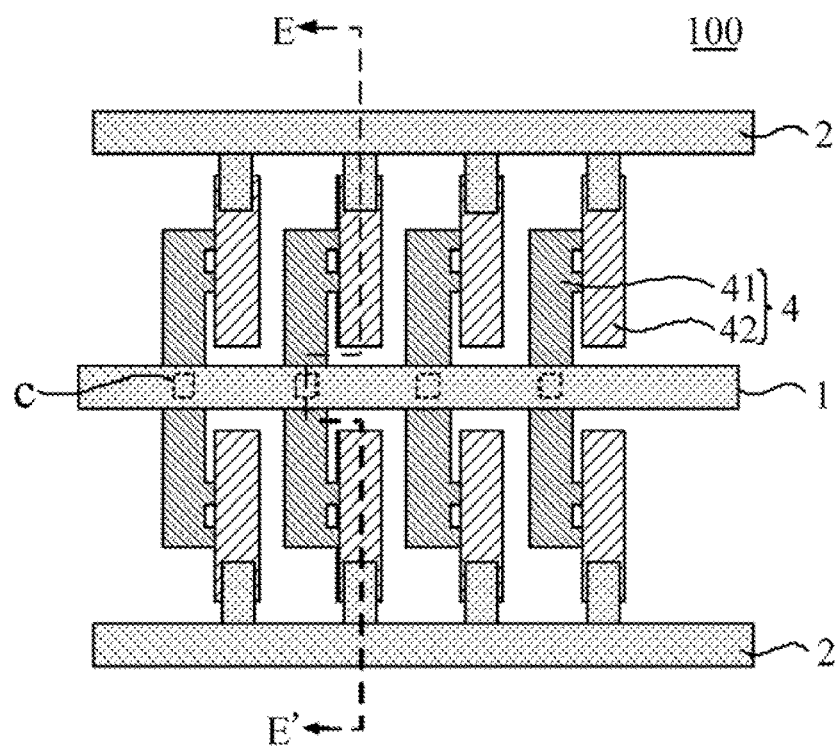
FIG. 5A is a structural diagram of yet another array substrate, according to some embodiments of the present disclosure.
Figure 5B:
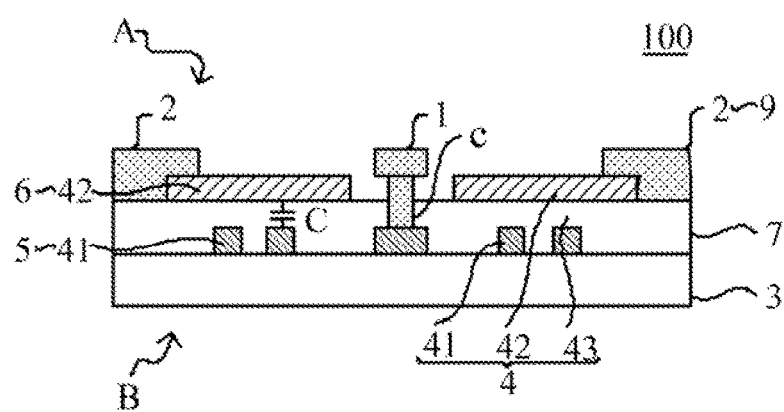
FIG. 5B is a sectional view of the array substrate along section line EE' in FIG. 5A.

As shown in FIGS. 4A to 4C, the gate layer 5 is located at the side of the semiconductor layer 6 away from the base substrate 3.

The at least two ESD protection devices 4 are divided into four groups, and each group includes two ESD protection devices 4. For example, the two ESD protection devices 4 are a first ESD protection device 4-1 and a second ESD protection device 4-2.

A fourth via hole d is disposed at a side of the second electrodes 42 of each of the first ESD protection device 4-1 and the second ESD protection device 4-2 away from the base substrate 3, and the fourth via hole d penetrates the gate insulating layer 7, the interlayer insulating layer 8 and the passivation layer 10. Two ends of one of the at least one third connection electrode 11a are respectively coupled to the second electrode 42 of the first ESD protection device 4-1 and the second electrode 42 of the second ESD protection device 4-2 through the fourth via hole d corresponding to the first ESD protection device 4-1 and the fourth via hole d corresponding to the second ESD protection device 4-2.

Figure 6A:
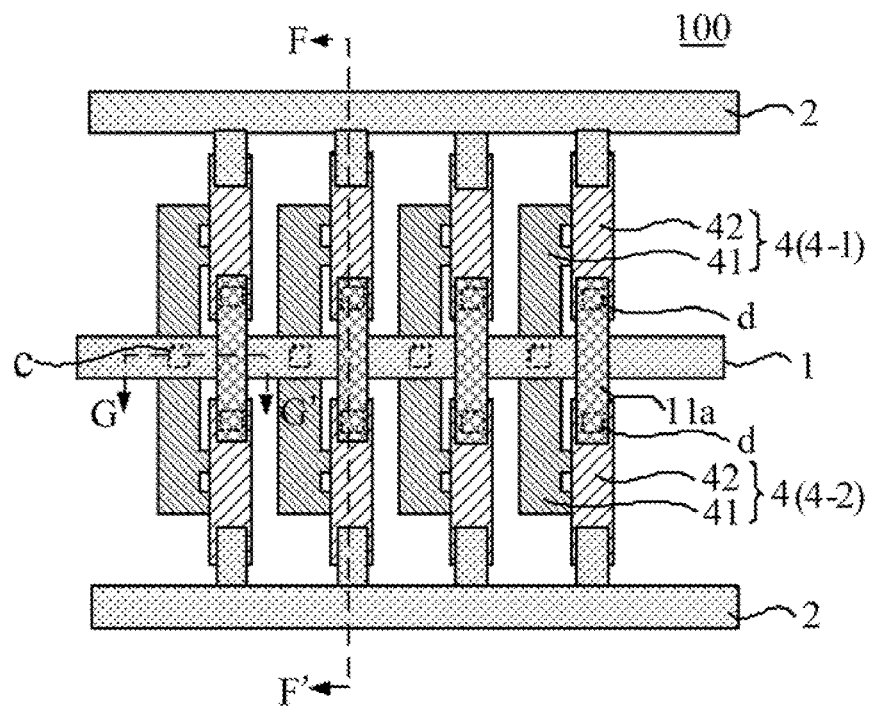
FIG. 6A is a structural diagram of yet another array substrate, according to some embodiments of the present disclosure.
Figure 6B:
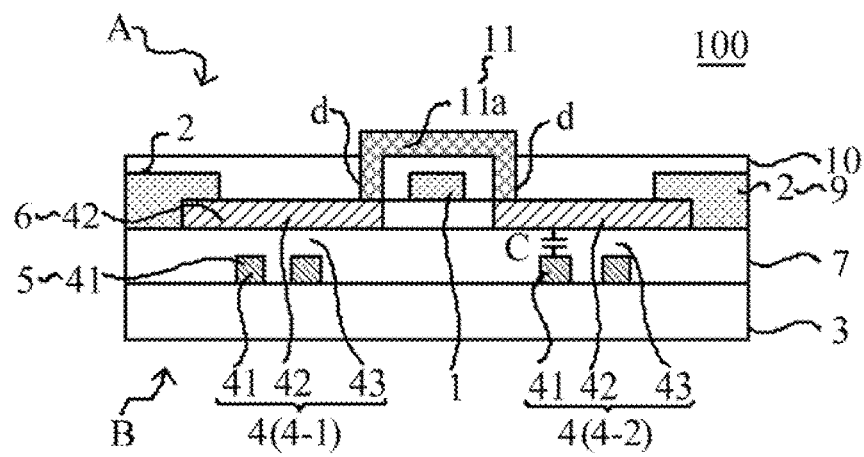
FIG. 6B is a sectional view of the array substrate along section line FF' in FIG. 6A.
Figure 6C:
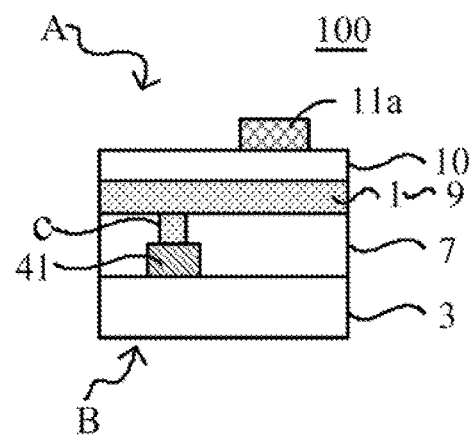
FIG. 6C is a sectional view of the array substrate along section line GG' in FIG. 6A.

As shown in FIGS. 6A to 60, the gate layer 5 is located at the side of the semiconductor layer 6 proximate to the base substrate 3.

The at least two ESD protection devices 4 are divided into four groups, and each group includes two ESD protection devices 4. For example, the two ESD protection devices 4 are a first ESD protection device 4-1 and a second ESD protection device 4-2.

A fourth via hole d penetrating the passivation layer 10 is disposed at a side of the second electrodes 42 of each of the first. ESD protection device 4-1 and the second ESD protection device 4-2 away from the base substrate 3. Two ends of one of the at least one third connection electrode 11a are respectively coupled to the second electrode 42 of the first ESD protection device 4-1 and the second electrode 42 of the second ESD protection device 4-2 through the fourth via hole d corresponding to the first ESD protection device 4-1 and the fourth via hole d corresponding to the second ESD protection device 4-2.

In the above embodiments, the second electrode 42 of the first ESD protection device 4-1 is coupled to the second electrode 42 of the second ESD protection device 4-2 through the third connection electrode 11a. In this way, in a case where a large amount of electrostatic charges instantaneously accumulate on the first signal line 1, the electrostatic charges may be discharged to the second signal line 2 corresponding to the two ESD protection devices 4 through the first ESD protection device 4-1 and the second ESD protection device 4-2, and the number of paths for the discharge of the electrostatic charges on the first signal line 1 is increased, so that the discharge of electrostatic charges may be faster and more efficient, and the ESD protection effect may be improved.

In a case where a large amount of electrostatic charges instantaneously accumulate on the first signal line 1, and the coupling between the second electrode 42 of one ESD protection device 4 (for example, the first. ESD protection device 4-1) and the second signal line 2 is damaged, the electrostatic charges may be shunted to the other ESD protection device (for example, the second ESD protection device 4-2) through the third connection electrode 11a, so that the static electricity is discharged, and the stability of the ESD protection device may be improved.

In some embodiments, the at least two ESD protection devices 4 are divided into at least one group, and each group includes two ESD protection devices 4. The two ESD protection devices 4 are a first ESD protection device 4 and a second ESD protection device 4. The first electrode 41 of the first ESD protection device 4 and the first electrode 41 of the second ESD protection device 4 are coupled to a same first signal line 1 through a same via hole.

For example, as shown in FIG. 4A, the at least two ESD protection devices 4 are divided into four groups, and each group includes two ESD protection devices 4. The two ESD protection devices 4 are a first ESD protection device 4-1 and a second ESD protection device 4-2. The first electrode 41 of the first ESD protection device 4-1 and the first electrode 41 of the second ESD protection device 4-2 are coupled to a same first signal line 1 through a same first via hole a that is located between the first electrode 41 of the first ESD protection device 4-1 and the first electrode 41 of the second ESD protection device 4-2 along a direction perpendicular to an extending direction of the first signal line 1.

In this way, the two ESD protection devices 4 in each group are both coupled to a same first signal line 1 through a same first via hole a, which may reduce the number of the first via holes to be arranged, thereby reducing the steps of manufacturing the array substrate 100, and improving the manufacturing efficiency.

In some examples, as shown in FIGS. 4A to 4B, in the at least one group of ESD protection devices 4, an orthographic projection of the first ESD protection device 4-1 and an orthographic projection of the second ESD protection device 4-2 in each group of ESD protection devices 4 on the base substrate 3 are symmetrically located at two opposite sides of an orthographic projection of the first signal line 1 (which is coupled to the first ESD protection device 4-1 and the second ESD protection device 4-2) on the base substrate 3 along the direction perpendicular to the extending direction of the first signal line 1 respectively.

Figure 2C:
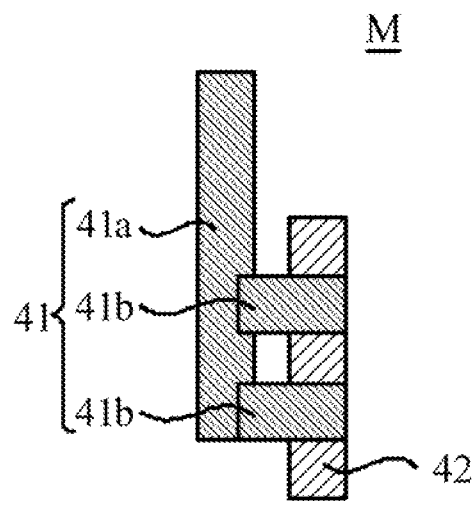
FIG. 2C is an enlarged view of region M in FIG. 2A.

In some embodiments, as shown in FIGS. 2A-2C, in the array substrate 100 provided by some embodiments of the present disclosure, the first electrode 41 included in the ESD protection device 4 includes one first sub-electrode 41a and at least two second sub-electrodes 41b. The at least two second sub-electrodes 41b are arranged side by side along an extending direction of the first sub-electrode 41a, the at least two second sub-electrodes 41b are arranged at a side of the first sub-electrode 41a proximate to the second electrode 42 along the extending direction of the first signal line 1, and the first sub-electrode 41a intersects with the at least two second sub-electrodes 41b. One end of the first sub-electrode 41a away from the second signal line 2 along the direction perpendicular to the extending direction of the first signal line 1 is coupled to the first signal line 1 through the first via hole a.

With reference to FIGS. 2A and 2B, each ESD protection device 4 includes: a first electrode 41, a second electrode 42, an insulating medium 43 disposed between the first electrode 41 and the second electrode 42, and a first connection electrode 44. The material of the second electrode 42 is a semiconductor material (for example, a heavily-doped semiconductor material). One end of the second electrode 42 proximate to a second signal line 2 along a direction perpendicular to an extending direction of the second signal line 2 is coupled to the second signal line 2 through the first connection electrode 44, and the other end of the second electrode 42 away from the second signal line 2 along the direction perpendicular to the extending direction of the second signal line 2 is suspended. The electrostatic charges are discharged through the ESD capacitance C existing in the ESD protection device 4 (i.e., the ESO capacitance existing between the first electrode 41 and the second electrode 42).

With reference to FIGS. 3A and 38, each ESD protection device 4 includes: a first electrode 41, a second electrode 42, an insulating medium 43 disposed between the first electrode 41 and the second electrode 42, and a second connection electrode 45. The material of the second electrode 42 is a semiconductor material (for example, a heavily-doped semiconductor material). Two ends of the second electrode 42 are connected together through the second connection electrode 45, which connects with the two ends through two second via holes b, and second connection electrode 45 is also coupled to a second signal line 2. The electrostatic charges are discharged through the ESD capacitance C existing in the ESD protection device 4 (i.e., the ESD capacitance existing between the first electrode 41 and the second electrode 42).

With reference to FIGS. 4A and 48, each ESD protection device 4 includes: a first electrode 41, a second electrode 42, an insulating medium 43 disposed between the first electrode 41 and the second electrode 42, and a first connection electrode 44. The material of the second electrode 42 is a semiconductor material (for example, a heavily-doped semiconductor material). One end of the second electrode 42 proximate to a second signal line 2 along a direction perpendicular to an extending direction of the second signal line 2 is coupled to the second signal line 2 through the first connection electrode 44, and the other end of the second electrode 42 away from the second signal line 2 along the direction perpendicular to the extending direction of the second signal line 2 is coupled to the third connection electrode 11a. The electrostatic charges are discharged through the ESD capacitance C existing in the ESO protection device 4 (i.e., the ESD capacitance existing between the first electrode 41 and the second electrode 42).

In the ESD protection device 4, the first electrode 41 includes one first sub-electrode 41a and at least two second sub-electrodes 41b. The at least two second sub-electrodes 41*b* are arranged side by side along the extending direction of the first sub-electrode 41*a*. That is, each ESD protection device 4 is regarded as a thin film transistor which is a double-gate thin film transistor, so that the leakage current of the ESD protection device 4 (the ESD protection device 4 is regarded as a thin film transistor) may be reduced, and the performance of the ESD protection device may be more stable.

Some embodiments of the present disclosure also provide an ESD protection circuit 200 disposed in the array substrate 100

In some embodiments, as shown in FIGS. 10A and 10B, the array substrate 100 includes a display area AA and a non-display area BB. The ESD protection circuit 200 is located in the non-display area BB.

Figure 7:
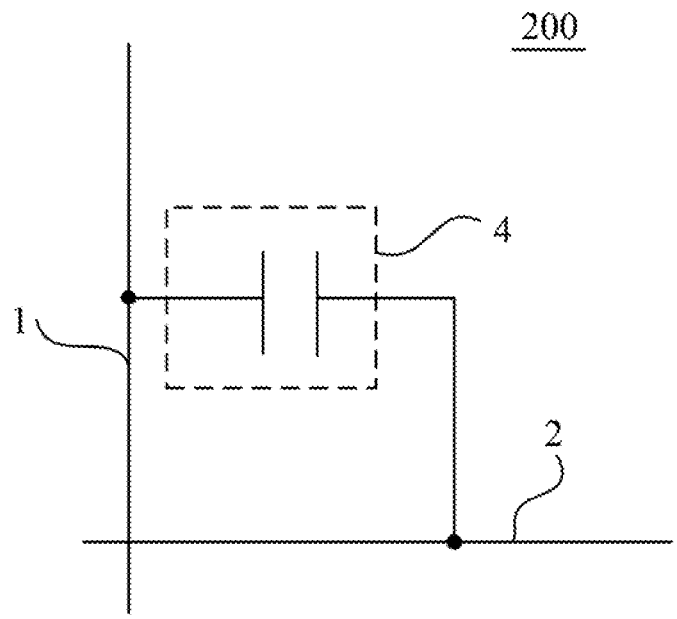
FIG. 7 is a structural diagram of an electrostatic discharge protection circuit, according to some embodiments of the present disclosure.
Figure 8:
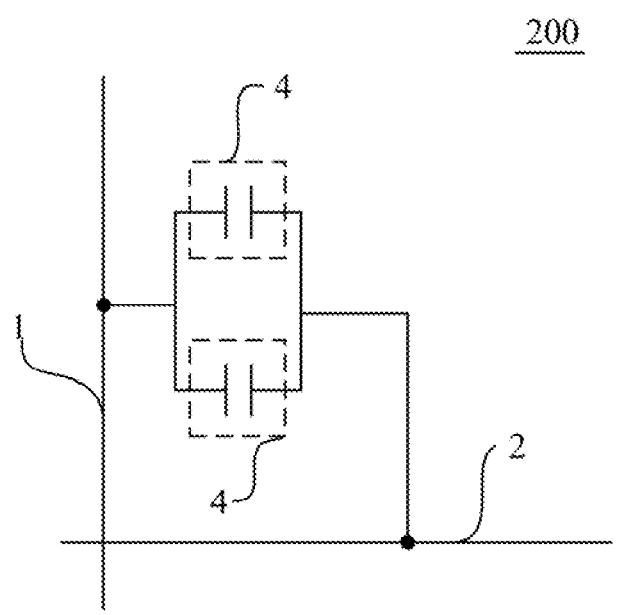
FIG. 8 is a structural diagram of another electrostatic discharge protection circuit, according to some embodiments of the present disclosure.
Figure 9:
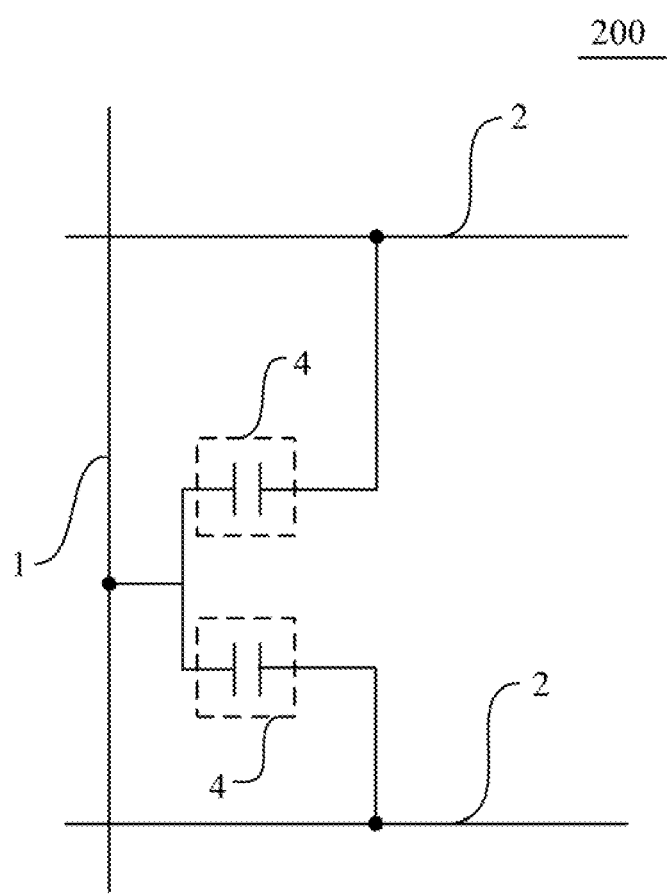
FIG. 9 is a structural diagram of yet another electrostatic discharge protection circuit, according to some embodiments of the present disclosure.

As shown in FIGS. 7 to 9, the ESD protection circuit 200 includes at least one ESD protection device 4, and a first end of each of the at least one ESD protection device 4 is coupled to one of the at least one first signal line 1 in the array substrate 100, and a second end of each of the at least one ESD protection device 4 is coupled to one of the at least one second signal line 2 in the array substrate 100. The ESD protection device 4 is configured to discharge the electrostatic charges on one of the first signal line 1 and the second signal line 2, which are coupled to the ESD protection device, to the other one.

In some embodiments, as shown in FIG. 10A, in a case where the array substrate 100 includes at least one test control line and at least one test signal line, the at least one first signal line 1 includes the test control line, and the at least one second signal line 2 includes the test signal line.

In some other embodiments, as shown in FIG. 10B, the array substrate 100 includes: gate line(s), data line(s), common voltage signal line(s), clock signal line(s), and level signal line(s). The at least one first signal line 1 includes at least one of the gate line(s), the data line(s), the common voltage signal line(s), the clock signal line(s), and the level signal line(s). The at least one second signal line 2 includes at least one of the gate line(s), the data line(s), the common voltage signal line(s), the clock signal line(s), and the level signal line(s).

In a case where there are no electrostatic charges accumulated on the first signal line 1 and the second signal line 2, the ESD protection circuit 200 does not work. When a large amount of electrostatic charges accumulate on the first signal line 1, the electrostatic charges are quickly discharged to the second signal line 2 through the ESD protection device 4 in the ESD protection circuit 200. Or, when a large amount of electrostatic charges accumulate on the second signal line 2, the electrostatic charges are quickly discharged to the first signal line 1 through the ESD protection device 4 in the ESD protection circuit. In this way, the electrostatic charges are prevented from affecting the normal operation of other electronic circuits (such as the pixel driving circuit).

In some embodiments, the ESD protection device 4 is a capacitor.

The voltage between two electrodes of the capacitor does not change suddenly, so the capacitor itself may suppress static electricity. Moreover, the capacitor has a decoupling function, and the decoupling ability of the first signal line 1 and the second signal line 2 may be improved by using the capacitor to decouple, and the anti-interference ability of the first signal line 1 and the second signal line 2 may be improved, so that the static electricity is prevented from affecting the normal operation of the electronic circuits.

In some embodiments, as shown in FIGS. 6 and 9, first ends of two ESD protection devices 4 are coupled to a same first signal line 1, and second ends of the two ESD protection devices 4 are coupled to a same second signal line 2 or different second signal lines 2.

In the embodiments, in a case where a large amount of electrostatic charges instantaneously accumulate on the first signal line 1 that is coupled to the first ends of the at least two ESD protection devices 4, the electrostatic charges may be discharged to different second signal lines 2 or to a same second signal line 2 through the at least two ESD protection devices 4. Thus, the number of paths for the discharge of the electrostatic charges on the first signal line 1 is increased, so that the discharge of electrostatic charges may be faster and more efficient, and the ESD protection effect may be improved.

In some embodiments, the ESD protection circuit 200 may be arranged in other manners, which is not limited herein as long as the function of electrostatic protection may be achieved.

Figure 11:
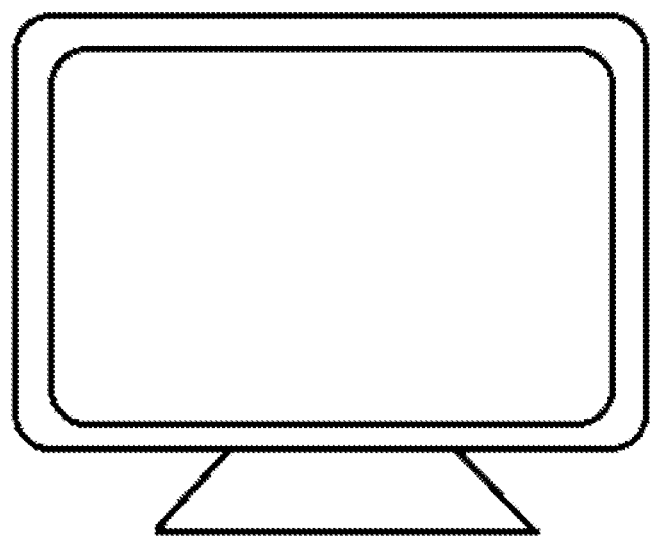
FIG. 11 is a structural diagram of a display apparatus, according to some embodiments of the present disclosure.

As shown in FIG. 11, some embodiments of the present disclosure further provide a display apparatus 300, and the display apparatus 300 includes the array substrate 100.

The display apparatus 300 provided by some embodiments of the present disclosure may be a liquid crystal display (LCD) apparatus, an organic light-emitting display (OLED) apparatus, or a quantum dot light-emitting display (QLED) apparatus.

In a case where the display apparatus 300 is a LCD apparatus, in addition to the array substrate 100, the display apparatus 300 includes an opposite substrate and a liquid crystal layer disposed between the opposite substrate and the array substrate 100.

In a case where the display apparatus 300 is an OLED apparatus, the display apparatus 300 includes an encapsulation layer for encapsulating the array substrate 100. The array substrate 100 further includes pixel driving circuit(s) and light-emitting device(s), and the light-emitting device includes an anode, a light-emitting layer, and a cathode. The encapsulation layer may be a thin film or a plate.

In addition, the display apparatus provided by some embodiments of the present disclosure may be any product or component having a display function such as an electronic paper, a mobile phone, a tablet computer, a television, a display, a notebook computer, a digital photo frame, or a navigator.

The beneficial effects achieved by the display apparatus 300 provided by the embodiments of the present disclosure are the same as that achieved by the array substrate 100, which will not be described herein again.

The forgoing descriptions are merely specific implementation manners of the present disclosure, but the protection scope of the present disclosure is not limited thereto. Any changes or replacements that a person skilled in the art could readily conceive of within the technical scope of the present disclosure shall be included in the protection scope of the present disclosure. Therefore, the protection scope of the present disclosure shall be subject to the protection scope of the claims.

What is claimed is:

1. An array substrate, comprising:
   a base substrate;
   at least one first signal line and at least one second signal line disposed at a first side of the base substrate;
   at least two electrostatic discharge (ESD) protection devices disposed at the first side of the base substrate, wherein the at least two ESD protection devices are divided into at least one group, and each group of ESD protection devices includes two ESD protection devices; the two ESD protection devices in each group of ESD protection devices are a first ESD protection device and a second ESD protection device; each ESD protection device includes:
- a first electrode coupled to one first signal line,
- a second electrode coupled to one second signal line, and
- an insulating medium disposed between the first electrode and the second electrode, wherein an orthographic projection of the first electrode on the base substrate at least partially overlaps with an orthographic projection of the second electrode on the base substrate, and the ESD protection device is configured to discharge electrostatic charges on one of the first signal line and the second signal line that are coupled to the ESD protection device to another one of the first signal line and the second signal line;

a gate layer disposed at the first side of the base substrate, wherein the gate layer includes the first electrode of the ESD protection device;

a semiconductor layer disposed at a side of the gate layer proximate to the base substrate, wherein the semiconductor layer includes the second electrode of the ESD protection device;

a gate insulating layer disposed between the gate layer and the semiconductor layer, wherein a portion of the gate insulating layer between the first electrode and the second electrode of the ESD protection device is the insulating medium;

an interlayer insulating layer disposed on the side of the gate layer away from the base substrate;

a source-drain electrode layer disposed on a side of the interlayer insulating layer away from the base substrate, wherein the source-drain electrode layer includes the at least one first signal line and the at least one second signal line;

a first via hole penetrating the interlayer insulating layer, wherein the first via hole is disposed at a side of the first electrode of the ESD protection device away from the base substrate, and the first electrode of the ESD protection device is coupled to the first signal line through the first via hole;

at least one second via hole penetrating the gate insulating layer and the interlayer insulating layer, wherein the at least one second via hole is disposed at a side of the second electrode of the ESD protection device away from the base substrate, and the second electrode of the ESD protection device is coupled to the second signal line through the at least one second via hole;

a passivation layer disposed on a side of the source-drain electrode layer away from the base substrate;

a pixel electrode layer disposed on a side of the passivation layer away from the base substrate, wherein the pixel electrode layer includes at least one third connection electrode; and at least one fourth via hole, wherein each fourth via hole at least penetrates the passivation layer, wherein one fourth via hole is disposed at a side of a second electrode of the first ESD protection device away from the base substrate, and one fourth via hole is disposed at a side of a second electrode of the second ESD protection device away from the base substrate; two ends of one third connection electrode are respectively coupled to the second electrode of the first ESD protection device and the second electrode of the second ESD protection device through one fourth via hole corresponding to the first ESD protection device and one fourth via hole corresponding to the second ESD protection device.

2. The array substrate according to claim 1, wherein a material of the second electrode is a heavily-doped semiconductor material, and a doping concentration of the heavily-doped semiconductor material ranges from $10^{18}/cm^3$ to $10^{22}/cm^3$.

3. The array substrate according to claim 1, wherein the at least one second via hole includes one second via hole, and
the ESD protection device further includes:
a first connection electrode, and the first connection electrode is disposed on the side of the interlayer insulating layer away from the base substrate and in the second via hole, wherein one end of the first connection electrode is coupled to the second signal line, and another end of the first connection electrode is coupled to one end of the second electrode proximate to the second signal line through the second via hole.

4. The array substrate according to claim 1, wherein the at least one second via hole includes two second via holes; and
the ESD protection device further includes:
a second connection electrode, and the second connection electrode is disposed on the side of the interlayer insulating layer away from the base substrate and in the two second via holes, wherein a first end of the second connection electrode is coupled to the second signal line directly, a second end of the second connection electrode is coupled to one end of the second electrode away from the second signal line through one of the two second via holes, and a third end of the second connection electrode is coupled to one end of the second electrode proximate to the second signal line through another one of the two second via holes; and
an orthographic projection of a portion of the second connection electrode disposed on the side of the interlayer insulating layer away from the base substrate on the base substrate at least partially overlaps with an orthographic projection of the first electrode on the base substrate.

5. The array substrate according to claim 1, wherein the at least one first signal line includes at least one test control line, and each test control line is configured to transmit test control signals to the array substrate; and
the at least one second signal line includes at least one test signal line, and each test signal line is configured to transmit test signals to the array substrate.

6. The array substrate according to claim 5, wherein the array substrate has a display area and a non-display area, and the non-display area is located at a periphery of the display area, and the at least one ESD protection device is disposed in the non-display area; and
the array substrate further comprises at least one pad disposed in the non-display area,
one pad is coupled to at least one test control line, and the at least one test control line is configured to transmit test control signals to the array substrate through the pad coupled to the at least one test control line; and
one pad is coupled to at least one test signal line, and the at least one test signal line is configured to transmit test signals to the array substrate through the pad coupled to the at least one test signal line.

7. The array substrate according to claim 1, further comprising: a gate line, a data line, a common voltage signal line, a clock signal line, and a level signal line that are disposed at the first side of the base substrate;
the at least one first signal line includes at least one of the gate line, the data line, the common voltage signal line, the clock signal line, and the level signal line; and
the at least one second signal line includes at least one of the gate line, the data line, the common voltage signal line, the clock signal line, and the level signal line.

8. The array substrate according to claim 1, wherein in each group of ESD protection devices, a first electrode of the first ESD protection device and a first electrode of the second ESD protection device are coupled to a same first signal line through a same first via hole.

9. The array substrate according to claim 1, wherein in each group of ESD protection devices, an orthographic projection of the first ESD protection device on the base substrate and an orthographic projection of the second ESD protection device on the base substrate are symmetrically located at two opposite sides of an orthographic projection of the first signal line that is coupled to the first ESD protection device and second ESD protection device on the base substrate along a direction perpendicular to an extending direction of the first signal line respectively.

10. The array substrate according to claim 9, wherein in at least one group of ESD protection devices, first electrodes of ESD protection devices in each group are coupled to a same first signal line; and
a second electrode of the at least one group of ESD protection devices located at a side of the first signal line along the direction perpendicular to the extending direction of the first signal line is coupled to one second signal line, and a second electrode of the at least one group of ESD protection devices located at an opposite side thereof along the direction perpendicular to the extending direction of the first signal line is coupled to another second signal line.

11. The array substrate according to claim 1, wherein the first electrode includes one first sub-electrode and at least two second sub-electrodes, the at least two second sub-electrodes are arranged at a side of the first sub-electrode proximate to the second electrode along an extending direction of the first signal line and are arranged side by side along an extending direction of the first sub-electrode, and the first sub-electrode intersects with the at least two second sub-electrodes; and
one end of the first sub-electrode away from the second signal line along a direction perpendicular to the extending direction of the first signal line is coupled to the first signal line through the first via hole.

12. A display apparatus, comprising the array substrate according to claim 1.

13. An array substrate, comprising:
a base substrate;
at least one first signal line and at least one second signal line disposed at a first side of the base substrate;
at least two electrostatic discharge (ESD) protection devices disposed at the first side of the base substrate, wherein the at least two ESD protection devices are divided into at least one group, and each group of ESD protection devices includes two ESD protection devices; the two ESD protection devices in each group of ESD protection devices are a first ESD protection device and a second ESD protection device; each ESD protection device includes:
a first electrode coupled to one first signal line,
a second electrode coupled to one second signal line, and
an insulating medium disposed between the first electrode and the second electrode, wherein an orthographic projection of the first electrode on the base substrate at least partially overlaps with an orthographic projection of the second electrode on the base substrate, and the ESD protection device is configured to discharge electrostatic charges on one of the first signal line and the second signal line that are coupled to the ESD protection device to another one of the first signal line and the second signal line;
a gate layer disposed at the first side of the base substrate, wherein the gate layer includes the first electrode of the ESD protection device;
a semiconductor layer disposed at a side of the gate layer away from the base substrate, wherein the semiconductor layer includes the second electrode of the ESD protection device;
a gate insulating layer disposed between the gate layer and the semiconductor layer, wherein a portion of the gate insulating layer between the first electrode and the second electrode of the ESD protection device is the insulating medium;
a source-drain electrode layer disposed on a side of the semiconductor layer away from the base substrate, wherein the source-drain electrode layer includes the at least one first signal line and the at least one second signal line;
a third via hole penetrating the gate insulating layer, wherein the third via hole is disposed at a side of the first electrode of the ESD protection device away from the base substrate, and the first electrode of the ESD protection device is coupled to the first signal line through the third via hole; the second electrode of the ESD protection device is coupled to the second signal line directly;
a passivation layer disposed on a side of the source-drain electrode layer away from the base substrate;
a pixel electrode layer disposed on a side of the passivation layer away from the base substrate, and the pixel electrode layer includes at least one third connection electrode; and
at least one fourth via hole, wherein each fourth via hole at least penetrates the passivation layer, and one fourth via hole is disposed at a side of a second electrode of the first ESD protection device away from the base substrate and one fourth via hole is disposed at a side of a second electrode of the second ESD protection device away from the base substrate; two ends of one third connection electrode are respectively coupled to the second electrode of the first ESD protection device and the second electrode of the second ESD protection device through one fourth via hole corresponding to the first ESD protection device and one fourth via hole corresponding to the second ESD protection device.

14. The array substrate according to claim 13, wherein in each group of ESD protection devices, a first electrode of the first ESD protection device and a first electrode of the second ESD protection device are coupled to a same first signal line through a same third via hole.

15. The array substrate according to claim 13, wherein in each group of ESD protection devices, an orthographic projection of the first ESD protection device on the base substrate and an orthographic projection of the second ESD protection device on the base substrate are symmetrically located at two opposite sides of an orthographic projection of the first signal line that is coupled to the first ESD protection device and the second ESD protection device on the base substrate along a direction perpendicular to an extending direction of the first signal line respectively.

16. The array substrate according to claim 15, wherein in at least one group of ESD protection devices, first electrodes of ESD protection devices in each group are coupled to a same first signal line; and
   a second electrode of the at least one group of ESD protection devices located at a side of the first signal line along the direction perpendicular to the extending direction of the first signal line is coupled to one second signal line, and a second electrode of the at least one group of ESD protection devices located at an opposite side thereof along the direction perpendicular to the extending direction of the first signal line is coupled to another second signal line.

17. The array substrate according to claim 13, wherein a material of the second electrode is a heavily-doped semiconductor material, and a doping concentration of the heavily-doped semiconductor material ranges from $10^{18}/cm^3$ to $10^{22}/cm^3$.

18. The array substrate according to claim 13, wherein the at least one first signal line includes at least one test control line, and each test control line is configured to transmit test control signals to the array substrate; and
   the at least one second signal line includes at least one test signal line, and each test signal line is configured to transmit test signals to the array substrate.

19. The array substrate according to claim 18, wherein the array substrate has a display area and a non-display area, and the non-display area is located at a periphery of the display area, and the at least one ESD protection device is disposed in the non-display area; and
   the array substrate further comprises at least one pad disposed in the non-display area,
   one pad is coupled to at least one test control line, and the at least one test control line is configured to transmit test control signals to the array substrate through the pad coupled to the at least one test control line; and
   one pad is coupled to at least one test signal line, and the at least one test signal line is configured to transmit test signals to the array substrate through the pad coupled to the at least one test signal line.

20. The array substrate according to claim 13, further comprising: a gate line, a data line, a common voltage signal line, a clock signal line, and a level signal line that are disposed at the first side of the base substrate;
   the at least one first signal line includes at least one of the gate line, the data line, the common voltage signal line, the clock signal line, and the level signal line; and
   the at least one second signal line includes at least one of the gate line, the data line, the common voltage signal line, the clock signal line, and the level signal line.

* * * * *